(12) United States Patent
Wang (10) Patent No.: US 7,034,591 B2
(45) Date of Patent: Apr. 25, 2006

(54) FALSE-LOCK-FREE DELAY LOCKED LOOP CIRCUIT AND METHOD

(75) Inventor: Binan Wang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 36 days.

(21) Appl. No.: 10/929,180

(22) Filed: Aug. 30, 2004

(65) Prior Publication Data

US 2006/0044021 A1    Mar. 2, 2006

(51) Int. Cl.
*H03L 7/06*    (2006.01)
(52) U.S. Cl. .................................... 327/158; 327/149
(58) Field of Classification Search ................ 327/149, 327/153, 158, 161, 163; 331/1.7, 25, DIG. 2; 375/375, 376
See application file for complete search history.

(56) References Cited

U.S. PATENT DOCUMENTS

| 5,994,934 | A | * | 11/1999 | Yoshimura et al. ......... 327/158 |
| 6,239,634 | B1 | | 5/2001 | McDonagh ................... 327/158 |
| 6,326,826 | B1 | | 12/2001 | Lee et al. ..................... 327/161 |

OTHER PUBLICATIONS

"CMOS DLL-Based 2-V 3.2-ps Jitter 1-GHz Clock Synthesizer and Temperature-Compensated Tunable Oscillator" by David J. Foley and Michael P. Flynn, IEEE Journal of Solid-State Circuits, vol. 36, No. 3, Mar. 2001, pp. 417-423.

* cited by examiner

*Primary Examiner*—Linh My Nguyen
(74) *Attorney, Agent, or Firm*—W. Daniel Swayze, Jr.; W. James Brady; Frederick J. Telecky, Jr.

(57)    ABSTRACT

A phase detector in a delay locked loop circuit operates to determine the status of propagation of a first pulse of a reference clock signal (CKref) through a delay line (21). A first control signal (DOWN) is produced a in response to represent a first time at which the first pulse has progressed entirely through the delay line (21) and a later second time at which a next second pulse of the reference clock signal (CKref) arrives at a first input of the phase detector (24A). The delay of the delay line (21) is reduced in response to the first control signal (DOWN). A second control signal (UP) is produced in response to the status to represent a third time at which the second pulse of the reference clock signal (CKref) arrives at the first input of the phase detector (24A) and a later fourth time at which the first pulse of the reference clock signal (CKref) has progressed to the end of the delay line (21) and is used to increase the delay of the delay line (21).

31 Claims, 6 Drawing Sheets

FALSE-LOCK-FREE DELAY LOCKED LOOP CIRCUIT AND METHOD

BACKGROUND OF THE INVENTION

The present invention relates generally to delay locked loop (DLL) circuits, and more particularly to circuitry for providing "false-lock-free" phase comparison in a delay locked loop circuit.

Delay locked loops (DLLs) are widely used in analog circuit design. The capability of a DLL to provide timing of clock signals that are precisely delayed relative to a reference clock signal is very valuable in many applications, such as circuits for eliminating clock skew, multi-phase clock generators, and clock/data recovery circuitry.

Figure 1:
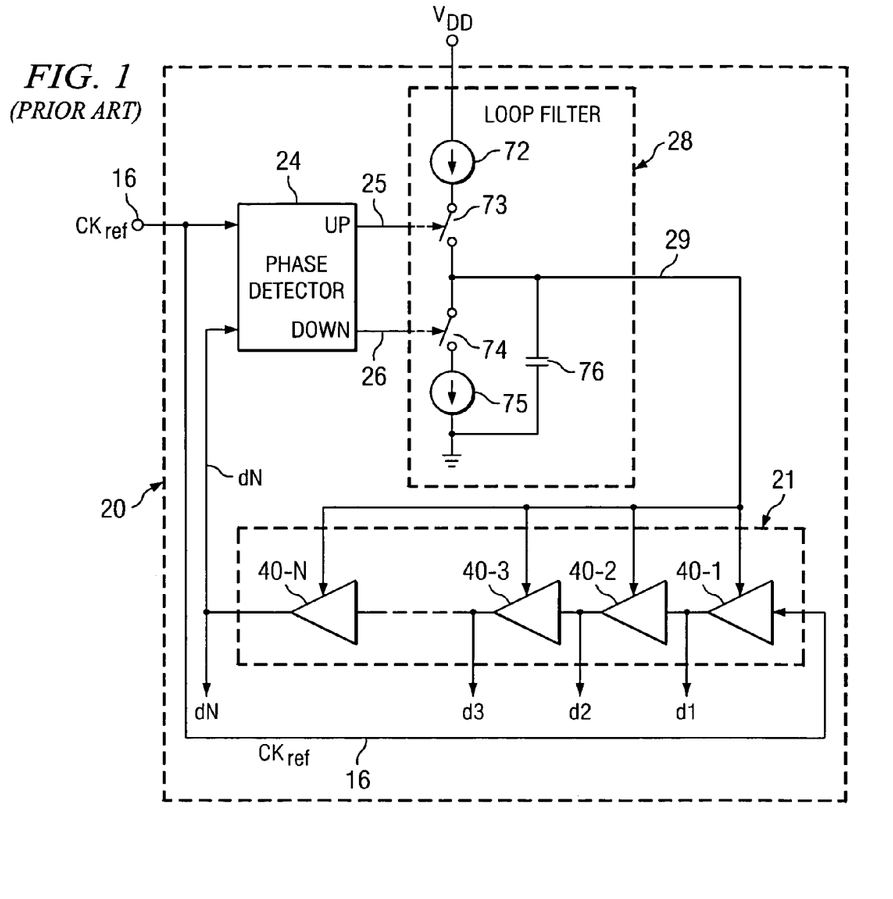
FIG. 1 is a detailed block diagram of a conventional DLL circuit.

FIG. 1 shows a conventional delay locked loop circuit 20 including a delay line 21. Delay line 21 includes N delay cells 40-1, 40-2 . . . 40-N as shown, wherein each delay cell includes a delay control input connected to delay control conductor 29. A reference clock CKref is applied as an input to the first delay cell 40-1 and a first input of a phase detector 24. The output d1 of the first delay cell 40-1 is connected to the input of the second delay cell 40-2. Similarly, the output d2 of the second delay cell 40-2 is connected to the input of the third delay cell 40-3, and so forth. The input of first delay cell 40-1 is connected by conductor 16 to receive a reference clock signal CKref. The output dN of the last delay cell 40-N is connected to a second input of phase detector 24. A control voltage on a delay control conductor 29 can be varied to adjust the delay through delay line 21. Thus, delay line 21 is made up by cascading multiple identical delay cells 40 the delay of which is set by the delay control signal on conductor 29.

Phase detector 24 produces a signal UP on conductor 25 and a signal DOWN on conductor 26, both of which are applied as inputs to a loop filter circuit 28. Loop filter circuit 28 is schematically illustrated as including a first current source 72 coupled between a power supply voltage VDD and one terminal of a switch 73, the other terminal of which is connected to delay control conductor 29. Switch 73 is controlled by the UP signal on conductor 25. A capacitor 76 is coupled between delay control conductor 29 and ground. A second switch 74 is connected between delay control conductor 29 and one terminal of a second current source 75, the other terminal of which is connected to ground. Switch 74 is controlled by the DOWN signal on conductor 26. The output of loop filter circuit 28 provides the delay control voltage on delay control conductor 29. Capacitor 76 acts as a loop filter, and the structure including switchable current sources 72 and 75 and capacitor 76 is commonly referred to as a charge pump.

In operation, a pulse of CKref ripples through delay line 21, creating a different phase of delayed clock signal at the respective outputs of each of the delay cells 40-1 through 40-N. Phase detector 24 compares the output pulse produced at the end of delay line 21 with the CKref pulse delayed by one reference clock cycle T. The CKref pulse delayed by one cycle time T is hereinafter referred to as the "next incoming pulse of CKref". The output of phase detector 24 controls loop filter circuit 28, which typically is a charge pump circuit. If the delay between the rising edge of the initial pulse of CKref and the rising edge of the resulting first pulse produced at the output dN of last delay cell 40-N is too long, phase detector 24 senses that condition and turns on switch 73 to dump more charge from current source 72 into capacitor 76 and thereby raise the voltage on delay control conductor 29, since a higher control voltage applied to the delay cells reduces the signal delay through them.

The feedback loop therefore operates to lock the rising edge of the output of the last delay cell 40-N with the rising edge of the next pulse of CKref, thereby ensuring that the total delay through delay line 21 is precisely equal to the period T of CKref. Similarly, if the delay through delay line 21 is too short, the feedback loop reduces the voltage across capacitor 76 so as to increase the delay time to the value of the reference clock period T in order to cause DLL 20 to acquire or maintain a correct lock condition.

Figure 2:
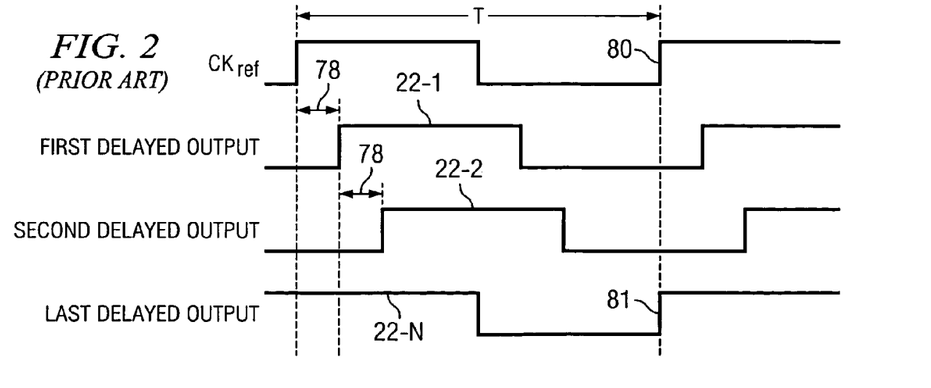
FIG. 2 is a timing diagram useful in explaining operation of conventional DLL circuit shown in FIG. 1.

Each of the N delay cells 40 produces a delay exactly equal to T/N, as indicated by reference numerals 78 in FIG. 2. Due to the ability of the feedback loop to adjust the delay control voltage on conductor 29, the delay through delay line 21 is insensitive to variations in parameters such as chip temperature, integrated circuit manufacturing process parameters, power supply voltage, and the like that would otherwise affect the delay through each cell.

In a conventional DLL, only the last delay cell output of the delay line is compared to the the next incoming pulse of CKref by the phase detector, which immediately produces an indication of the phase difference between the input dN and an incoming pulse of CKref. A problem of the conventional DLL of FIG. 1 is that it may try to "lock onto" an incorrect pulse that is delayed by an integer number nT of periods of the input clock, where n is greater than 1. This is condition known as a "false-lock" condition.

Figure 3A:
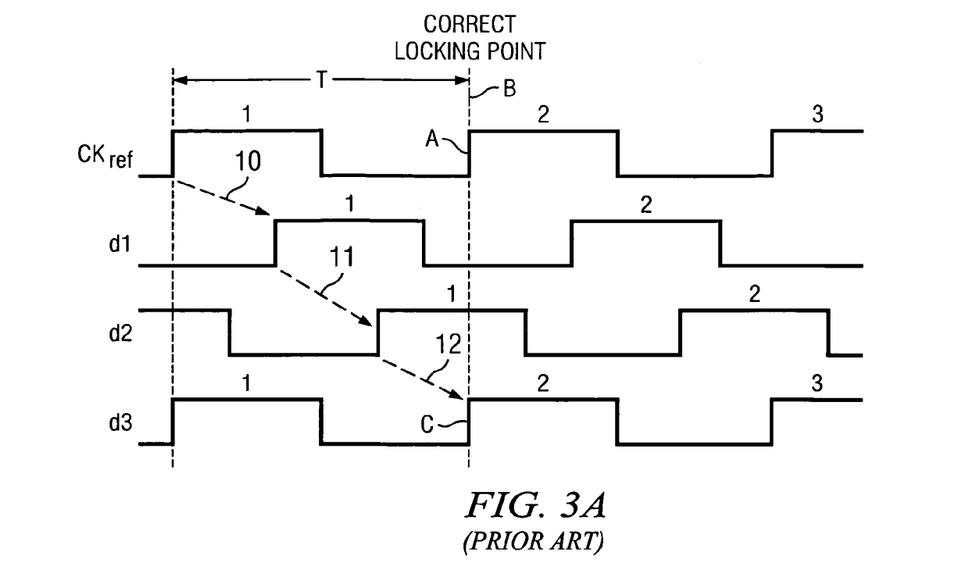
FIG. 3A is a timing diagram which illustrates "correct lock" operation in a DLL.
Figure 3B:
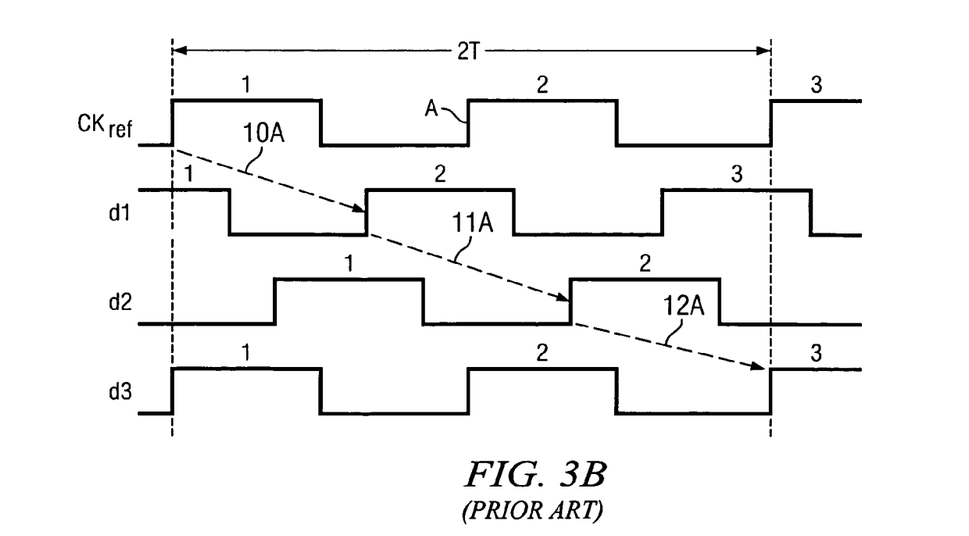
FIG. 3B is a timing diagram which illustrates "false-lock" operation in a DLL.

The timing diagrams of FIGS. 3A and 3B illustrate a "correct lock" condition and a "false-lock" condition, respectively, in the DLL of FIG. 1. Note that a typical prior art phase detector can "lock in" either the correct lock condition shown in FIG. 3A or the false-lock condition of FIG. 3B.

FIG. 3A illustrates a "correct lock" condition in a DLL having (as an example) only three delay cells in its delay line. The DLL receives a reference clock CKref and produces delay cell outputs d1, d2 and d3 which are shown in FIG. 3A. Since the feedback loop forces the total delay through the delay line 21 to be equal to T, the delay through each delay cell is equal to T/3. Arrow 10 indicates when the delay through the first delay cell occurs, arrow 111 indicates when the delay through the second delay cell occurs, and arrow 12 indicates when the delay through the third delay cell occurs. The rising edge C of the second pulse of the output d3 is shown as being correctly locked into alignment with the rising edge A of the second pulse of CKref. Arrow B indicates the correct locking time for the DLL.

Similarly, FIG. 3B also illustrates the reference clock CKref and the outputs d1, d2 and d3 of a DLL including a delay line having only three delay cell. However, in this case the DLL is in a "false-lock" condition wherein the feedback loop forces the total delay through the delay line to be equal to 2T rather than the correct delay T. The delay through each delay cell therefore is 2T/3 instead of T/3, and arrows 10A, 11A and 12A indicate the times during which the delay through the each of the three delay cells occurs. When a DLL is in a false-lock condition, it generates a delay time nT that is equal to an integral multiple n of T, where n is greater than 1. Such a false-lock condition usually is an undesirable condition, especially if it persists, because it would produce unintended signal delays, which would be likely to cause circuit malfunctions and sometimes may have disastrous results.

U.S. Pat. No. 6,239,634 entitled "Apparatus and Method for Ensuring the Correct Start-up and Locking of a Delay Locked Loop", issued May 29, 2001, discloses one approach to preventing a false-lock condition in a DLL by clamping the delay line control voltage to a proper level during start-up operation or a reset operation in order to ensure locking in of a "correct lock" condition rather than a "false lock" condition. In order to accomplish that, the precise delay characteristics of the voltage controlled delay line must be accurately known so that the loop capacitor of the loop filter can be charged or discharged to the correct control voltage. This approach clamps or presets the loop filter output voltage to a certain level in order to force the total signal delay through the delay line to be close to its normal value T. Then the phase detector can readily bring the delay locked loop to the correct lock condition and avoid a false-lock condition.

A problem with this approach is that the value at which to pre-set the loop filter output voltage must be known. However, this value is highly dependent on manufacturing process parameter variations, temperature variations, power supply voltage variations, and period/frequency of CKref. This makes it difficult to provide the preset or clamp value of the loop filter output voltage to with a preset or clamp value that can cause the loop to reliably lock on the correct rising edge of the output voltage dN of the last delay cell. The foregoing technique is capable of guaranteeing only a proper start-up operation. If the prior art DLL 20 is ever caused to be in a false-lock condition, there is no mechanism to allow the feedback loop to recover to a correct lock condition.

Unfortunately, the "robustness" of the loop operation described in U.S. Pat. No. 6,239,634 is compromised because a correct lock condition can only be guaranteed by performing a reset operation.

Another known approach to dealing with a false-lock condition in a DLL is to "measure" the delay time/frequency range by monitoring the output of all of the delay cells in the delay line. If the delay time/frequency is outside of a proper range, the phase detector control of charging and discharging the loop filter capacitor is disabled, and a monitoring circuit takes over to charge or discharge the loop filter capacitor until the delay through the delay line falls within the proper range. Specifically, if that delay falls outside of a normal "correct lock" range, the monitoring circuit takes over and drives the loop filter capacitor to an approximate voltage in a correct predetermined range. This allows the feedback loop and the phase detector to take over operation and re-establish a correct lock condition. The foregoing technique is illustrated in U.S. Pat. No. 6,326,826 entitled "Wide Frequency-Range Delay-Locked Loop Circuit" issued Dec. 4, 2001 and the article "CMOS DLL-based 2-V 3.2-ps Jitter 1-Ghz Clock Synthesizer and Temperature-Compensated Tunable Oscillator", IEEE JSSC, Vol. 36, No. 3, March 2001.

Shortcomings of the foregoing approaches include the need for the additional monitoring circuit referred to and also additional analog components shown in the two foregoing prior art references. Also, the monitoring circuitry and associated correction circuitry designed for use in conjunction with a particular delay line usually would not be usable for a different delay line having a different number of delay cells without extensive modification.

Thus, there is an unmet need for a DLL circuit that avoids false-lock conditions.

There also is an unmet need for a DLL circuit that readily automatically recovers from false-lock conditions.

There also is an unmet need for a DLL circuit that avoids the need to provide additional circuitry to preset or clamp the output voltage of a loop filter circuit in order to enable the DLL circuit to reliably establish and/or maintain a correct lock condition.

There also is an unmet need for a DLL circuit that avoids the need for a reset operation in order to ensure a correct lock condition.

There also is an unmet need for a DLL circuit that avoids the need to provide a monitoring circuit to take over charging or discharging of the loop filter capacitor until the DLL feedback loop is able to take over and reliably establish a correct lock condition.

There also is an unmet need for a DLL circuit design the basic structure of which is essentially independent of the number of delay cells in a delay line of the DLL circuit.

There also is an unmet need for a DLL circuit including a phase detector having substantially increased information monitoring capability that enables the DLL circuit to avoid false-lock conditions.

SUMMARY OF THE INVENTION

It is an object of invention to provide a DLL circuit that avoids false-lock conditions.

It is another object of the invention to provide a DLL circuit that readily automatically recovers from false-lock conditions.

It is another object of the invention to provide a DLL circuit that avoids the need to provide additional circuitry to preset or clamp the output voltage of a loop filter circuit in order to enable the DLL circuit to reliably establish and/or maintain a correct lock condition.

It is another object of the invention to provide a DLL circuit that avoids the need for a reset operation in order to ensure a correct lock condition.

It is another object of the invention to provide a DLL circuit that avoids the need to provide a monitoring circuit to take over charging or discharging of the loop filter capacitor until the DLL feedback loop is able to take over and reliably establish a correct lock condition.

It is another object of the invention to provide a DLL circuit design the basic structure of which is essentially independent of the number of delay cells in a delay line of the DLL circuit.

There also is an unmet need for a DLL circuit including a phase detector having substantially increased information monitoring capability to monitor the status of progression of a reference clock polls through the delay line of the DLL and use that information to avoid false-lock conditions.

Briefly described, and in accordance with one embodiment, the present invention provides a method of operating a phase detector in a delay locked loop circuit by determining the status of propagation of a first pulse of a reference clock signal (CKref) through a delay line (21) of the delay locked loop circuit, producing a first control signal (DOWN) in response to the status of propagation such that the first control signal (DOWN) represents a first time (C in FIG. 10B) at which the first pulse of the reference clock signal (CKref) has progressed entirely through the delay line (21) and a later second time (A in FIG. 10B) at which a second pulse of the reference clock signal (CKref) delayed from the first pulse by one reference clock signal period (T) arrives at a first input of the phase detector (24A), and producing a second control signal (UP) in response to the status of propagation such that the second control signal (UP) represents a third time (B in FIG. 10A) at which the second pulse of the reference clock signal (CKref) arrives at the first input of the phase detector (24A) and a later fourth time (E in FIG.

Figure 10A:
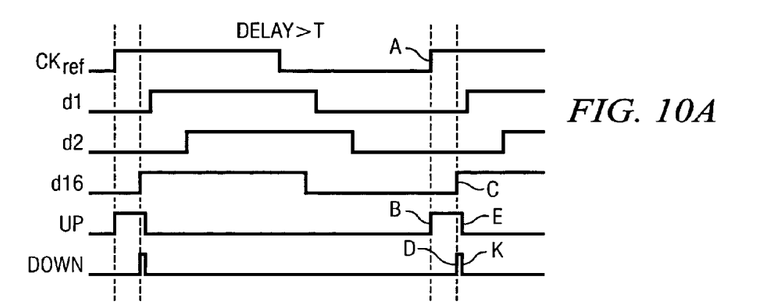
FIGS. 10A, 10B and 10C are timing diagram useful in explaining the operation of the embodiments shown in FIGS. 6 and 8.

10A) at which the first pulse of the reference clock signal (CKref) has progressed to the end of the delay line (21). The first (DOWN) and second (UP) control signals are filtered, and a delay of the delay line (21) is increased in response to the first control signal (DOWN) if the filtering substantially removes the second control signal (UP) or the delay of the delay line (21) is decreased in response to the second control signal (UP) if the filtering substantially removes the first control signal (DOWN).

In a described embodiment, a delay locked loop circuit includes a delay line (21) including an input for receiving a reference clock signal (CKref), a plurality of sequentially coupled delay cells (40-1,2 . . . N) each having an output (d1,2 . . . N), and a delay control input for receiving a delay control signal (29) and a phase detector (24A) including a first input for receiving the reference clock signal (CKref) and a plurality of inputs coupled to a group of outputs (d1,2 . . . ) of a plurality of the delay cells (40-1,2 . . . N), respectively. A loop filter (28) generates the delay control signal (29) in response to the phase detector (24A). The phase detector (24A) includes a first enable circuit (44) having a first input for receiving the reference clock signal (CKref) and including first circuitry (64) having a plurality of inputs coupled to the group of outputs (d1,2 . . . ), respectively, for indicating the progress of a first pulse of the reference clock signal (CKref) through the delay line (21), the first enable circuit (36) producing a first enable signal (DOWN-ENABLE) which indicates that the first pulse of the reference clock signal (CKref) has progressed to an end of the delay line (21)). The phase detector also includes a second enable circuit (44) having a first input for receiving the reference clock signal (CKref) including second circuitry (64 & 50–55) having a plurality of inputs coupled the group of outputs (d1,2 . . . ), respectively, for monitoring the progress of the first pulse of the reference clock signal (CKref) through the delay line (21), the second enable circuit (44) producing a second enable signal (UP-ENABLE) which indicates that the first pulse of the reference clock signal (CKref) is progressing through but has not reached the end of the delay line (21). A phase/frequency detector circuit (38) includes a first input coupled to the first enable signal (DOWN-ENABLE) and a second input coupled to the second enable signal (UP-ENABLE) for producing a first control signal (DOWN) coupled to a first input of the loop filter (28) and a second control signal (UP) coupled to a second input of the loop filter (28) in response to the first (DOWN-ENABLE) and second (UP-ENABLE) enable signals, the first control signal (DOWN) representing a first time (C in FIG. 10B) at which the first pulse of the reference clock signal (CKref) has progressed entirely through the delay line (21) and a later second time (A in FIG. 10B) at which a second pulse of the reference clock signal (CKref) delayed from the first pulse by one reference clock. period (T) arrives at the first input of the phase detector (24A, the second control signal (UP) representing a third time (B in FIG. 10A) at which the second pulse of the reference clock signal (CKref) arrives at the first input of the phase detector (24A) and a later fourth time (E in FIG. 10A) at which the first pulse of the reference clock signal (CKref) has progressed to the end of the delay line (21). The loop filter (28) changes the delay control signal to reduce the delay of the delay line (21) in response to the first signal control signal (UP) or changing the delay control signal to increase the delay of the delay line (21) in response to the second signal control signal (DOWN). The group of outputs includes the outputs of all of the delay cells (40-1,2 . . . N).

The first enable circuit (44) includes a flip-flop chain (64) having a first input coupled to receive the first pulse of the reference clock signal (CKref), the flip-flop chain (64) including a plurality of sequentially coupled flip-flops clocked by various outputs (d1,2 . . . N) of the delay cells, the first enable signal (DOWN-ENABLE) being produced in response to an output (q16) of a last flip-flop of the flip-flop chain (64). The first enable circuit (44) includes ANDing circuitry (87) having a first input coupled to the output (q16) of a last flip-flop of the flip-flop chain (64) and a second input coupled to the second enable circuit (34). The second enable circuit (34) produces a signal that indicates the presence of a "1" propagating through a last section of the delay line (21). The ANDing circuitry (87) logically ANDs the output (q16) of the last flip-flop of the flip-flop chain (64) and a result of a logical ORing of the outputs (q9–16) of a last section of the flip-flop chain (64) that corresponds to the last section of the delay line (21). The second enable circuit (34) includes the flip-flop chain (64), first ORing circuitry (50–53,54) having a plurality of inputs coupled to outputs of various ones of the plurality of sequentially coupled flip-flops, the second enable signal (UP-ENABLE) being produced in response to an output of the first ORing circuitry (50–53,54). The second enable circuit (34) also includes second ORing circuitry (55) having a first input coupled to the output of the second ORing circuitry (50–53,54) and a second input coupled to receive the first control signal (DOWN).

DETAILED DESCRIPTION OF THE PREFERRED EMBODIMENTS

The present invention solves the above mentioned problems of the prior art by building more capability into the phase detector of a DLL circuit. Instead of comparing only the output of the last delay cell of the delay line with the reference clock signal CKref, a plurality of or all of the delay cell output signals are provided as inputs to the phase detector. This allows it to utilize information regarding the status of propagation of a pulse of the reference clock signal CKref through the delay line in a way that avoids sustained false-lock conditions.

Figure 4:
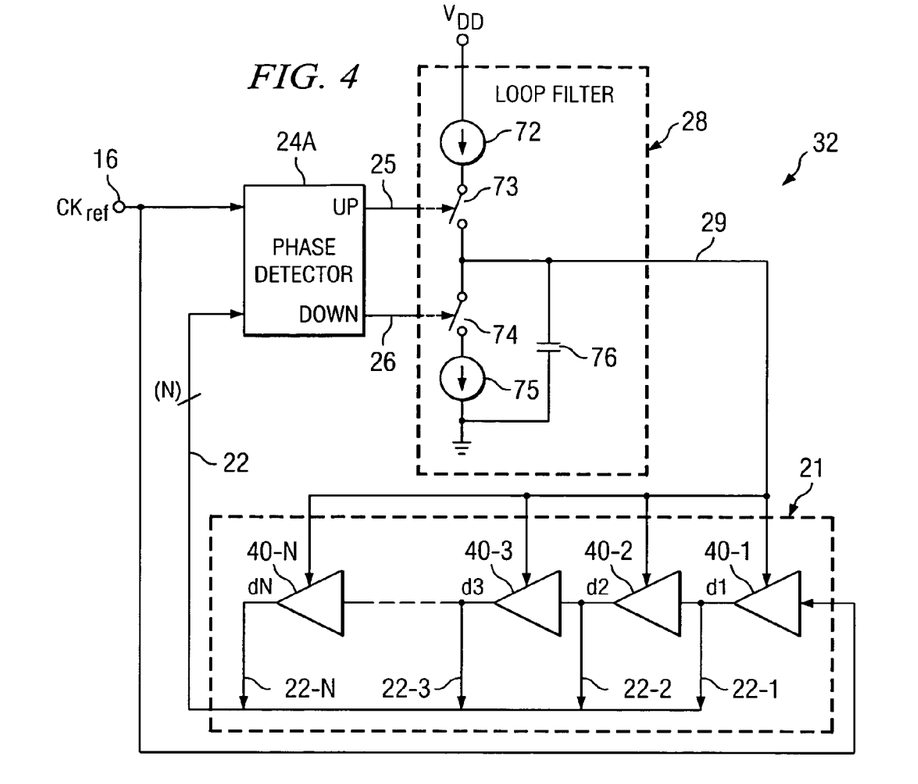
FIG. 4 is a detailed block diagram of a false-lock-free DLL circuit of the present invention.

Referring to FIG. 4, a false-lock-free DLL 32 includes the same delay line 21 and loop filter circuit 28 shown in "prior art" FIG. 1. False-lock-free DLL 32 includes a phase detector 24A having its clock input coupled to CKref. As in prior art FIG. 1, delay line 21 includes N delay cells 40-1, 40-2 ... 40-N, wherein each delay cell includes a delay control input connected to delay control conductor 29. The outputs of delay cells 40-1, 40-2 ... 40-N produce signals d1, d2 ... dN on conductors 22-1, 22-2 ... 22-N, respectively. The output of the first delay cell 40-1 is connected by conductor 22-1 to the input of the second delay cell 40-2. Similarly, the output of the second delay cell 40-2 is connected by conductor 22-2 to the input of the third delay cell 40-3, and so forth. The input of first delay cell 40-1 is connected by conductor 16 to receive a reference clock signal CKref. (By way of definition, the term "delay cell" as used herein is intended to encompass both voltage controlled delay cells and current controlled delay cells. Current controlled delay cells may include voltage-to-current conversion circuitry in order to be responsive to a delay control voltage signal.)

Figure 5:
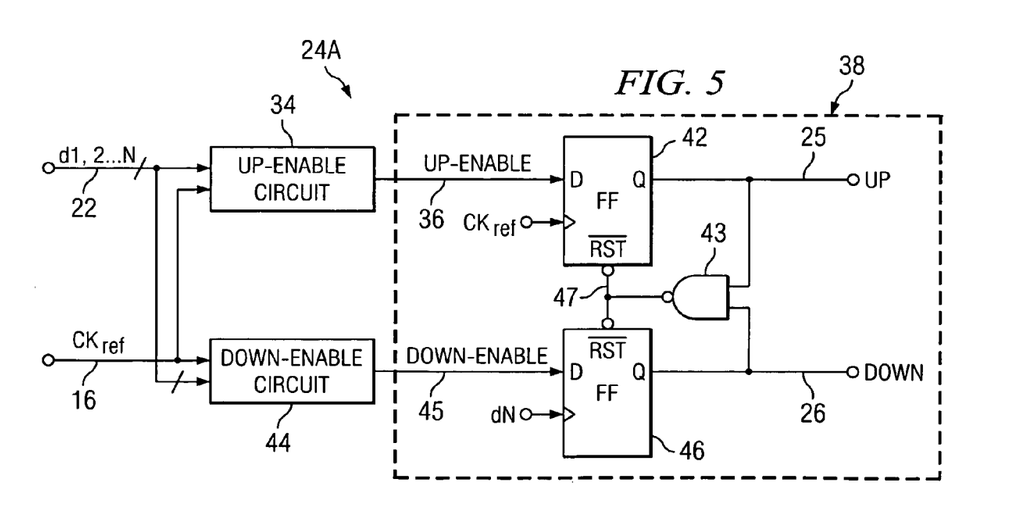
FIG. 5 is a block diagram of an implementation of the improved phase detector the false-lock-free DLL circuit of FIG. 4.

As in prior art FIG. 1, phase detector 24A produces a signal UP on conductor 25 and a signal DOWN on conductor 26. However, unlike prior art DLL circuit 20 of FIG. 1 wherein only the output 22-N of the last delay cell 40-N is connected by conductor 22-N to an input of phase detector 24, a plurality of or all of the delayed output signals d1, d2 ... dN are provided as inputs to phase detector 24A of FIG. 5. In FIG. 5, all of the delayed output signals d1, d2 ... dN are provided as inputs to phase detector 24A of FIG. 5 via a N-conductor bus 22. The structure of phase detector 24A of the present invention is substantially different than that of phase detector 24 of prior art of FIG. 1. The differences from the prior art phase detector 24 in FIG. 1 enable false-lock-free DDL circuit 32 of FIG. 4 to effectively avoid the false-lock conditions of the prior art DLL circuits by monitoring the reference clock signal and the progress of a pulse of CKref through delay line 21 by monitoring the delay cell output signals d1, d2 ... dN and using that information to prevent sustained false lock conditions.

As in prior art FIG. 1, loop filter circuit 28 includes a charging current source 72 coupled between power supply voltage VDD and one terminal of a switch 73. The other terminal of switch 73 is connected to delay control conductor 29. Switch 23 is controlled by the UP signal on conductor 25. A capacitor 76 is coupled between delay control conductor 29 and ground. A second switch 74 is connected between delay control conductor 29 and one terminal of a discharging current source 75, the other terminal of which is connected to ground. Switch 74 is controlled by the DOWN signal on conductor 26.

Referring to FIG. 5, improved phase detector 24A includes an up-enable circuit 34 having a clock input connected to receive reference clock signal CKref and N inputs connected to delay cell outputs d1, d2 ... dN, respectively. However, it is possible and may be practical to connect fewer than all of the delay cell outputs to inputs of phase detector 24. For example, doubling the number of delay cells and using the outputs of every other delay cell would produce the same result.

Phase detector 24A also includes a down-enable circuit 44 having a clock input connected to receive reference clock signal CKref and N inputs connected to receive delay cell output signals d1, d2 ... dN, respectively. An output signal UP-ENABLE is produced on conductor 36 by up-enable circuit 34 and applied to the D input of a D-type flip-flop 42 in a phase/frequency detector circuit 38. An output signal DOWN-ENABLE is produced on conductor 45 by down-enable circuit 44 and applied to the D input of a D-type flip-flop 46 in phase/frequency detector circuit 38.

Unlike a conventional phase/frequency detector wherein the D inputs of the D type flip-flops are held at a high or "1" level, in phase detector 24A of the present invention the D inputs of flip-flops 42 and 46 are controlled by the "intelligent" up-enable circuit 34 and "intelligent" down-enable circuit 44 which monitor and utilize relative delay information regarding the dN and CKref signals being compared in a way that makes it possible to avoid sustained false-lock conditions.

The clock input of flip-flop 42 is coupled to CKref, and the clock input of flip-flop 46 is connected to the output dN of the last delay cell 40-N. The reset (RST) inputs of flip-flops 42 and 46 are connected by conductor 47 to the output of a NAND gate 43. The signal UP is produced on the Q output of flip-flop 42, which is connected by conductor 25 to one input of NAND gate 43. The signal DOWN is produced on the Q output of flip-flop 46, which is connected by conductor 26 to the other input of NAND gate 43.

When the signal UP-ENABLE is at a "0" level a "0" is latched into flip-flop 42 in response to the next delayed CKref pulse, which causes the Q output of flip-flop 42 to go to a "0" level. When the signal UP-ENABLE goes to a "1" level, a "1" is loaded into flip-flop 42 when the next delayed CKref pulse arrives, which causes the signal UP on conductor 25 to go to a "1" level. Somewhat similarly, when the signal DOWN-ENABLE is at a "0" level, the signal DOWN on the Q output of flip-flop 46 remains low, and when DOWN-ENABLE goes to a "1", then when dN arrives a "1" is loaded into flip-flop FF46, which causes the signal DOWN on conductor 26 to go to a "1" level.

Figure 6:
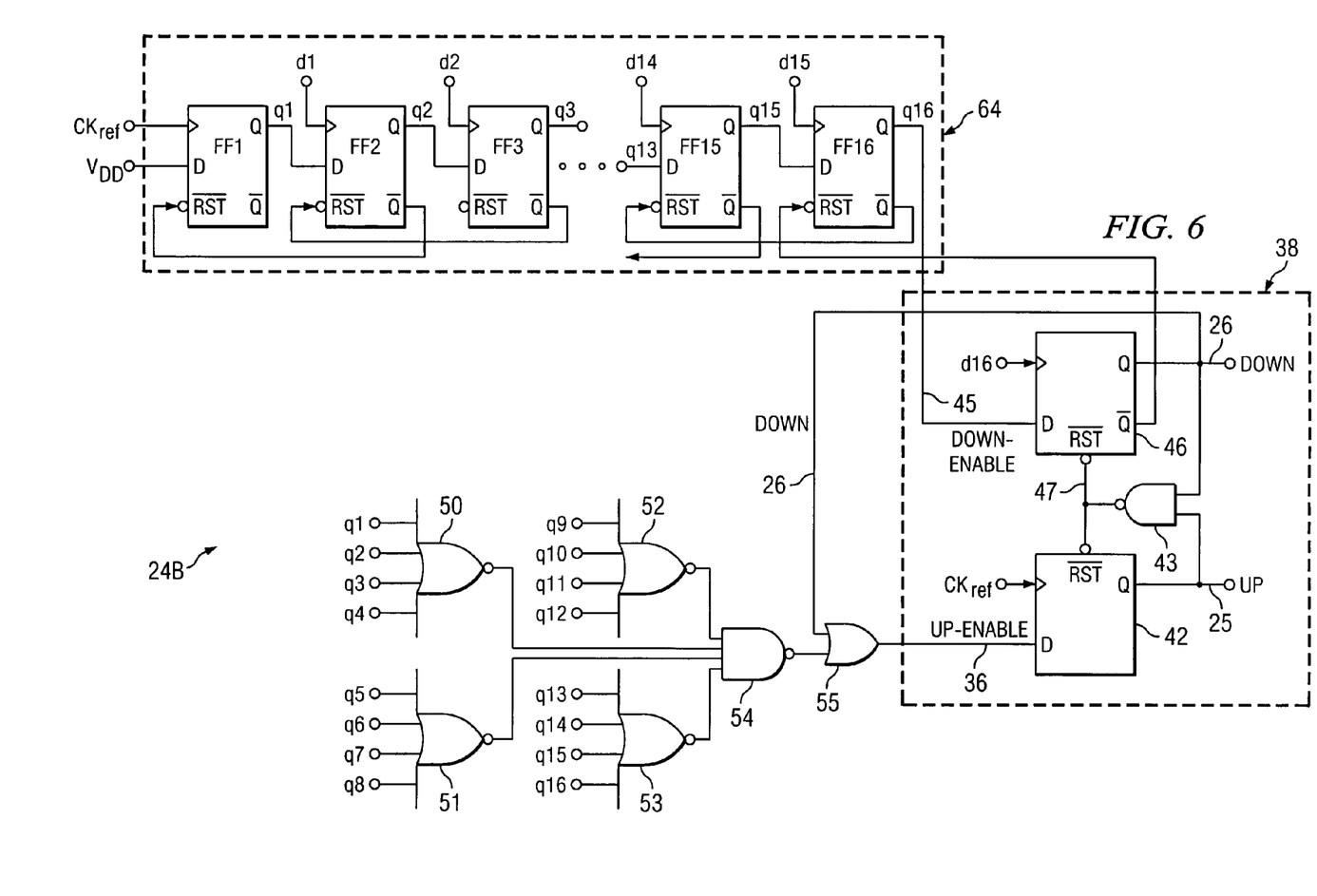
FIG. 6 is a detailed logic diagram of one embodiment of the phase detector shown in FIG. 4.
Figure 8:
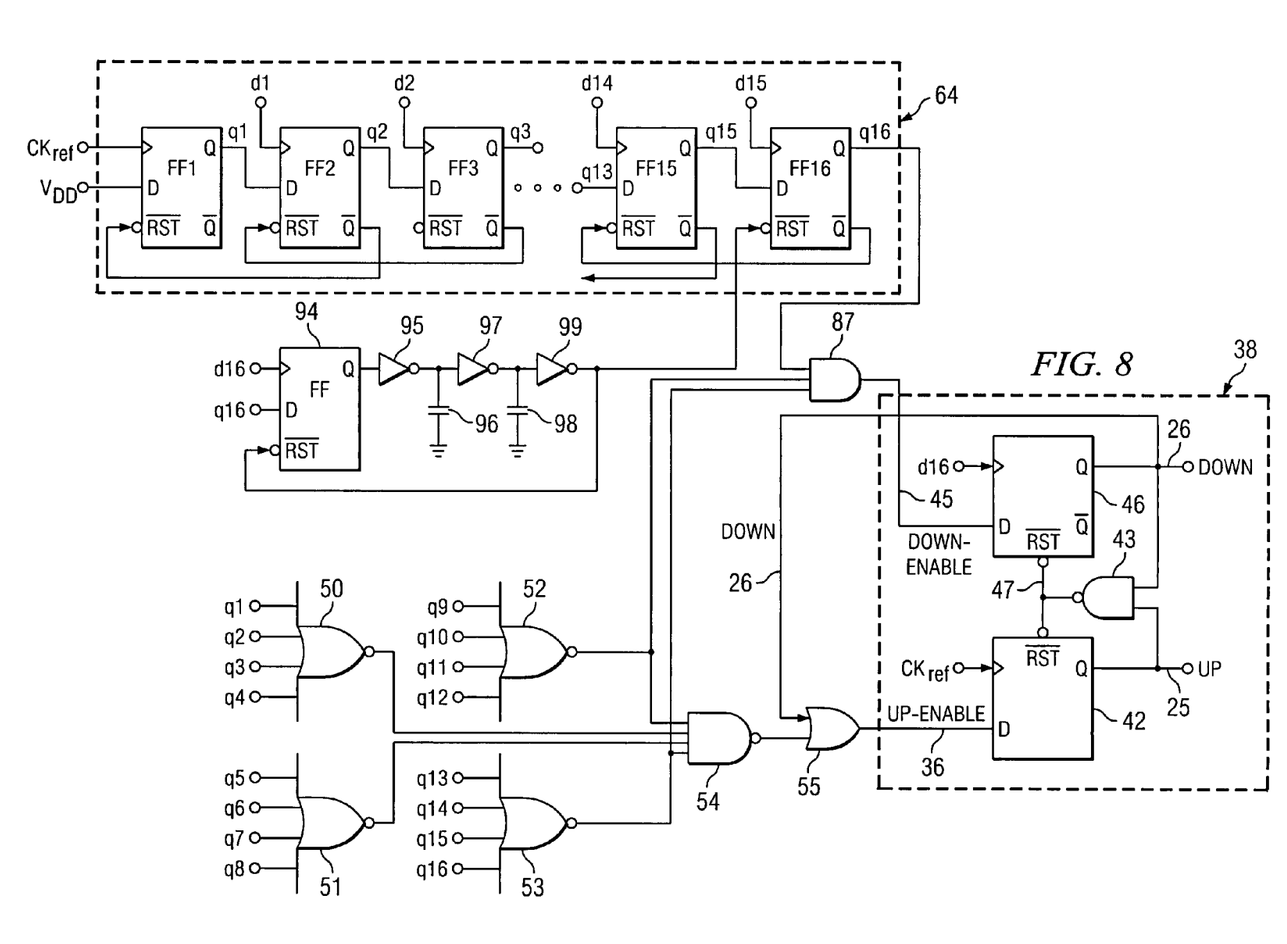
FIG. 8 is a detailed logic diagram of a preferred embodiment of the phase detector of FIG. 5.
Figure 9:
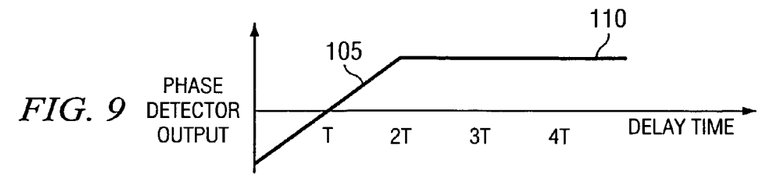
FIG. 9 illustrates a transfer function of the phase detector of FIG. 8.

FIGS. 6 and 8 show details of two implementations of up-enable circuit 34 and down-enable circuit 44. The subsequent description of the operation of the phase detectors 24B and 24C shown in FIGS. 6 and 8, respectively, refers to the timing diagrams of FIGS. 10A–C, which show waveforms of reference clock CKref, delay line outputs d1, d2 and dN, the loop filter capacitor charging signal UP, and the loop filter capacitor discharging signal DOWN for the cases when the delay of delay line 21 is too long (FIG. 10A), too short (FIG. 10B), and when the feedback loop is in a correct lock condition (FIG. 10C).

FIG. 6 shows a detailed block diagram of a phase detector 24B for use in a first embodiment of DLL 32 in which N is equal to 16, i.e., wherein delay line 21 includes 16 delay cells. Reference clock CKref is coupled to the clock input of the first flip-flop D-type FF1 of a chain of 16 D-type flip-flops, which is referred to herein as "FF chain 64". The q1, q2 ... q15 outputs of flip-flops FF1, FF2 ... FF15 are connected to the D inputs of flip-flops FF2, FF3 ... FF16, respectively. The delay cell output signals d1, d2 ... dN each are coupled to the clock input of the next one of the remaining flip-flops FF2, FF3 ... FF16, respectively, of FF chain 64. Up-enable circuit 34 of FIG. 5 as implemented in FIG. 6 includes FF chain 64 and four 4-input NOR gates 50, 51, 52 and 53 which feed into a four-input NAND gate 54, followed by a OR gate 55. Phase/frequency detector circuit 38 is the same in FIG. 6 as in FIG. 5.

When a first CKref pulse arrives at the clock input of FF1 in FF chain 64, this causes a "1" to appear on the first shift register output q1, assuming all of the outputs of the flip-flops in FF 64 are initially at a "0" level. When the edge of delay cell output signal d1 arrives, it causes the "1" in flip-flop FF1 to propagate into the next flip-flop FF2 and appear as its output signal q2, and then propagate to cause q3, q4, etc. as d2, d3, etc. to go to "1 levels until the "1" propagating through FF chain 64 finally reaches q16. As the "1" propagates through FF chain 64, the inverted output of each flip-flop FF2, FF3 . . . FF16 controls the asynchronous reset input of the previous flip-flop in FF chain 64 and clears the "1" to a "0" as it propagates to the next flip-flop.

In the embodiment of FIG. 6, the signal on q16 functions as the signal DOWN-ENABLE on conductor 45, and is coupled to the D input of flip-flop 46 in phase/frequency detector (PFD) circuit 38. Down-enable circuit 44 (FIG. 5) as implemented in FIG. 6 simply consists of FF chain 64. The outputs q1 through q16 of FF chain 64 indicate or "track" the status of the above-mentioned first CKref pulse as it propagates through delay line 21 and thereby indicate whether the delay of delay line 21 is too short (i.e., too fast) or too long (i.e., too slow).

FF chain 64 is shared between up-enable circuit 34 and down-enable circuit 44. Note that FF chain 64 is different than a typical shift register, because in a typical shift register the same clock signal is connected to simultaneously clock all of the flip-flops. However, FF chain 64 receives the outputs d1,2 . . . d15 of the first 15 cell of delay line 21 so as to sequentially clock flip-flops FF2, FF3 . . . FF16, respectively.

Up-enable circuit 34 also includes NOR gates 50, 51, 52 and 53, NAND gate 54, and OR gate 55 of phase detector 24B in FIG. 6. The four inputs of NOR gates 50, 51, 52, and 53 are connected to q1–4, q5–8, q9–12 and q13–16, respectively. The outputs of NOR gates 50-53 are connected to the inputs of NAND gate 54, the output of which is connected to one input of OR gate 55. The other input of OR gate 55 is connected to the signal DOWN on conductor 26. The signal UP-ENABLE on conductor 36 is produced on the output of OR gate 55.

The first CKref pulse is clocked through FF chain 64 in response to the propagation of the same first CKref pulse as it propagates through delay line 21 and thereby produces the above-mentioned "1" pulse that sequentially appears on the q2, q3 . . . q16 outputs of flip-flops FF2, FF3 . . . FF16 in response to delay cell output signals d1, d2 . . . dN, respectively. This accurately indicates where the first CKref pulse is as it propagates through delay line 21. Specifically, the first CKref pulse edge causes a "1" on the q1 output of a flop FF1 and slightly later it also causes a transition of the first delay cell output signal d1 which clocks that "1" into flip-flop FF2, and so forth. This causes a corresponding "1" to also propagate through FF chain 64. The inverting output of each of flip-flops FF2, FF3 . . . FF16 is fed back to the reset input of the previous flip-flop so that each of flip-flops FF2–FF16 is reset to "0" as soon as the "1" propagates from it to the next flip-flop.

The signal DOWN-ENABLE occurs when the above-mentioned "1" propagates all the way through delay line 21 and appears as its output signal q16, which is equal to DOWN-ENABLE.

Figure 10B:
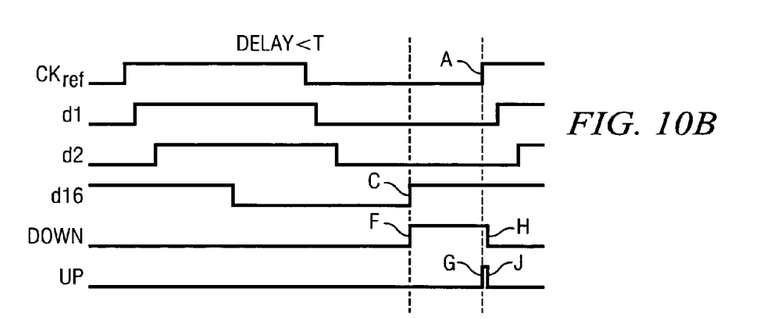
Figure 10C:
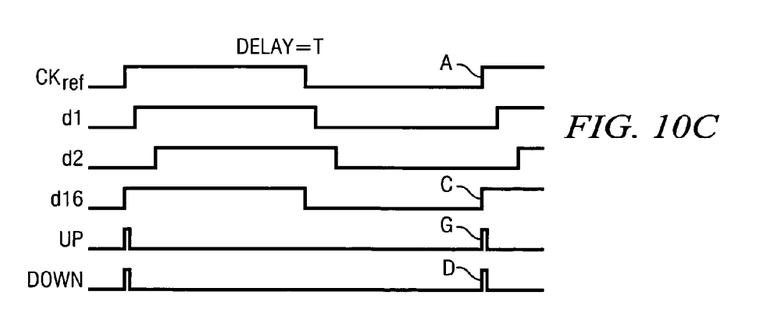

In the timing diagrams of FIGS. 10A–C, "A" designates the rising edge of the "next" CKref pulse. If edge A of the next CKref pulse has not yet arrived at the input of phase detector 24B when q16/DOWN-ENABLE goes to a "1" level as shown in FIG. 10B, that indicates the delay through delay line 21 is too fast because in a "lock condition" the next CKref pulse and the output d16 at the end of delay line 21 should arrive simultaneously at the input of phase detector 24B. If the delay through delay line 21 is too fast, q16/DOWN-ENABLE prematurely goes to a "1" and is latched into flip-flop 46 by d15, causing DOWN to go to a "1". In that case, q16/DOWN-ENABLE enables DOWN as indicated by edge F in FIG. 10B and causes loop filter circuit 28 to discharge loop filter capacitor 76 until edge A of the next CKref pulse arrives. This discharges capacitor 76 and lowers the delay control voltage on delay control conductor 29 and thereby causing it to increase the delay through the delay line 21.

The signal DOWN is fed back on conductor 26 to one input of OR gate 55, so when DOWN goes to a "1", this causes UP-ENABLE to go to a "1". When the next CKref pulse arrives, UP goes to a "1". Since UP and DOWN then are both at a "1", NAND gate 43 resets both flip-flops 42 and 46. At a given time, only one of the signals UP and DOWN can be at a "1" for a short time to charge or discharge capacitor 76. Therefore, when edge A of the next CKref pulse arrives, a "1" is latched into flip-flop 42, causing edge G of UP to go to a "1" level. This causes NAND gate 43 to reset flip-flops 42 and 46 to a "0", which quickly results in falling edge H of DOWN and falling edge J of UP in FIG. 10B, and thereby accomplishes a "neutralizing" of the signal DOWN.

The signal UP-ENABLE on conductor 36 goes to a "1" whenever (1) the signal DOWN on conductor 26 is a "1", or (2) whenever there is at least one "1" in FF chain 64. In the former condition (1), phase detector 24B "neutralizes" the signal DOWN from a "1" level to a "0" level as soon as the next rising CKref edge arrives. In the latter condition (2), phase detector 24B prevents UP-ENABLE from going to a "1" level when there are no "1"s in FF chain 64. If none of the flip-flop outputs q1, q2 . . . q16 is at a "1", the next (i.e. second) CKref pulse does not clock flip-flop 42 to cause the UP signal to go to a "1"level because a new "1" has not yet propagated all the way through delay line 21, so the output of NOR gate 55 is at a "0" level. This is important when operation of the feedback loop is just starting, for example during a power-up operation, because it allows the DLL feedback loop to have a full cycle T during which to utilize the delay information regarding the status of propagation of a CKref pulse through delay line 21 before phase detector 24B makes a decision as to whether UP or DOWN should go to a "1" level.

If the delay through delay line 21 is too slow, edge A of the next (i.e. second) CKref pulse arrives at the clock input of flip-flop 42 before a "1" propagates all the way to edge C of d16 at the end of FF chain 64 as indicated in FIG. 10A, so even if DOWN is at a "0", at least one of the flip-flops in FF chain 64 contains a "1". This causes the output of one of the NOR Gates 50–53 to be at a "0", which causes the output of NAND gate 54, and hence the signal UP-ENABLE on the output of OR gate 55, to be a "1". As soon as edge A of the next (i.e. second) CKref pulse arrives at the clock input of flip-flop 42 it latches a "1" into flip-flop 42 and causes edge B of UP to go to a "1", as shown in FIG. 10A. That turns on switch 72, causing loop filter circuit 28 to add charge to capacitor 76, thereby increasing the voltage on delay control conductor 29 and reducing the delay through delay line 21. When edge C of d16 goes to a "1" level, that clocks the "1" on q16/DOWN-ENABLE into flip-flop 46, producing edge D of DOWN. Since UP and DOWN are both at a "1" level, NAND gate 43 immediately resets flip-flops 42 and 46, producing edge E of UP and edge K of DOWN.

When edge A of the next (i.e. second) CKref pulse arrives simultaneously with edge C of d15 as shown in FIG. 10C, UP and DOWN both immediately go to a "1" level and both are then immediately reset to "0" (i.e. neutralized) by NAND gate 43. The widths of the narrow UP and DOWN pulses in FIGS. 10A–10C correspond to the signal propagation delay in the reset feedback loop. The loop filter capacitor 76 in loop filter circuit 28 essentially removes or filters out the extremely narrow pulses of the signals UP and DOWN shown in FIGS. 10A–C.

In contrast to the prior art, wherein the phase detector instantly produces the results of a comparison of the next CKref pulse and the output at the end of the delay line, phase detector 24B of FIG. 6 has an entire reference clock cycle delay T from the beginning of its comparison operation in which to generate either an UP charging pulse or a DOWN discharging pulse. Unlike the prior art, this time interval allows phase detector 24B to have sufficient time to correctly determine whether to generate an UP pulse or a DOWN pulse. By utilizing the delay information from the delay cell outputs, the phase detector of the present invention is able to reliably avoid any sustainable false-lock condition. And as long as the DLL loop bandwidth is properly controlled, delay locked loop circuit 32 will be stable.

Figure 7:
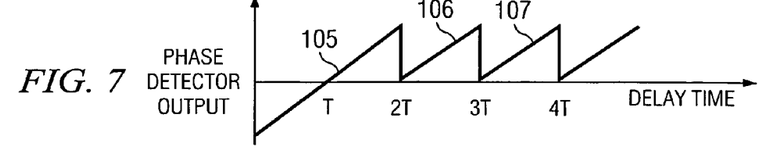
FIG. 7 illustrates a transfer function of the phase detector of FIG. 6.

FIG. 7 shows the transfer function of phase detector 24B of FIG. 6. The linearity in the transfer function is preserved when the delay through delay line 21 is within one period T of CKref, as indicated by reference numeral 105 in FIG. 7. At the end of every clock period T, the DLL output "wraps around" and again begins from a "0" level. If the total delay through delay line 21 is nT, where n is an integer>1, the DLL loop operation will be locked in a false-lock condition which, however, is unsustainable.

As a practical matter, this is not actually a significant problem. For example, if the DLL loop is in a false-lock condition, any interference or clock jitter of CKref or circuit noise will cause variation in the delay of incoming reference clock edges and delayed clock signals coming out of delay line 21. As soon as a small amount of phase error is built up, the DDL loop will charge capacitor 76 of loop filter circuit 28 to a higher voltage, causing the delay through delay line 21 to become shorter irrespective of whether the phase is leading or lagging. Therefore, the delay through delay line 21 never can remain very long at 2T, 3T etc. That is, signal delays of exactly 2T, 3T, etc. are not sustainable because there will always be reference clock jitter or delayed clock signal jitter that causes the delay through delay line 21 to be not exactly equal to 2T, 3T etc. Consequently, loop filter circuit 28 will eventually charge up capacitor 76 and shorten the delay to T, at which point DLL 32 will lock in at a signal delay equal to T. DLL 32 including phase detector 24B of FIG. 6 therefore will always automatically revert to a "correct lock" condition. Thus, a false-lock condition can occur in but cannot be sustained in a delay locked loop including phase detector 24B of FIG. 6.

Note that a problem of phase detector 24B of FIG. 6 is that if delay line 21 is too slow, the signal UP is asserted but then is too quickly "neutralized" by a DOWN signal because the signal DOWN-ENABLE is activated as soon as the "1" in FF chain 16 reaches q16. That causes slow recovery of a DLL including phase detector 24B of FIG. 6 from a false lock condition to a correct lock condition at 3T or longer in FIG. 7.

The false-lock conditions at 2T, 3T etc. as shown in FIG. 7 can be completely circumvented by the phase detector 24C shown in FIG. 8, because when DLL 32 is correctly locked at T, there should be only one "1" in FF chain 64 at any given time. If the signal delay through delay line 21 becomes longer than T, an extra "1" will appear in FF chain 64. If the DLL loop were to be in a false-lock condition with a delay of 2T, 3T etc., there would be two or three, etc. equally spaced "1"s, respectively, in FF chain 64. A small amount of logic circuitry is provided in down-enable circuit 44 in the embodiment of FIG. 8, in addition to the logic circuitry shown in FIG. 6, to eliminate the false-lock conditions shown in the transfer function of FIG. 7 at delay times of 2T, 3T etc.

The phase detector 24C of FIG. 8 differs from phase detector 24B of FIG. 6 with respect to how DOWN-ENABLE is asserted. Additional logic circuitry is provided for generation of DOWN-ENABLE on conductor 45 to solve the above-mentioned problem of phase detector 24B of FIG. 6. Specifically, the circuitry in FIG. 8 is the same as in FIG. 6, except that DOWN-ENABLE is produced by AND gate 87 in response to q16 and outputs of NOR Gates 52 and 53. Thus, in the embodiment of FIG. 8, an additional requirement before the signal DOWN-ENABLE can go a "1" level is that none of the outputs of the last 8 flip-flops except q16 can be at a "1" level when the delay through delay line 21 is not greater than 2T. When the delay through delay line 21 is greater than 2T, an additional "1" appears in the second half of FF chain 64 when q16 is at a "1" level. In that case, the additional logic disables DOWN-ENABLE, causing it to remain at a "0". This prevents UP from being prematurely neutralized and thereby allows UP to remain at a "1" for a longer period of time than in phase detector 24B of FIG. 6. This allows faster recovery from a transitory fast-lock condition than if phase detector 24B of FIG. 6 is used.

In the embodiment of FIG. 6, DOWN-ENABLE is the output signal q16 of FF chain 64, which goes to a "1" to indicate that a "1" has propagated through FF chain 64. However, in phase detector 24C of FIG. 8, in order for DOWN-ENABLE to go a "1", not only should the output q16 of FF chain 64 be a "1", but there should also be a single "1" in the last half (i.e., the last eight flip-flops) of FF chain 64. This is because if, for example, the delay through delay line 21 is three times greater (i.e., 3T) than it should be (i.e., T), then during the amount of time required for a CKref pulse to propagate through delay line 21, CKref would arrive at the input of FF chain 64 three times. If a false-period were to occur at 3T in FIG. 7, then there would be three "1"s in FF chain 64 at any given time. If the additional monitoring circuitry including logic gates 84, 85, and 87 in phase detector 24C in FIG. 8 sees more than two "1"s present in FF chain 64, that means the delay through delay line 21 is greater than T, and the additional monitoring circuitry disables DOWN-ENABLE by causing it to be a "0". This is what prevents DOWN from prematurely neutralizing UP when there is a long delay greater than 2T in delay line 21 and allows rapid charging of capacitor 76 and allows a rapid recovery to a permanent correct lock condition.

The reset input of flip-flop FF16 is connected to the output of a reset circuit including flip-flop 94, inverters 95, 97, and 99, and capacitors 96 and 98 instead of being connected to the inverting output of flip-flop 46 as in FIG. 6. Inverters 95, 97, and 99, capacitors 96 and 98, and flip-flop 94 are used to ensure that a minimum width negative pulse is applied to the reset input of flip-flop 94 in order to ensure that a reset of FF16 is performed reliably.

If the delay through delay line 21 is greater than 2T, then when q16 goes to a "1" level there will be two or more "1"s in the entire FF chain 64. There are two "1"s in the second half of FF chain 64, including the "1" level of q16. In that case, AND gate 87 prevents DOWN-ENABLE from going to a "1" level, and UP remains at a "1" level without being neutralized until the delay through delay line 21 decreases to less than 2T. When the delay line through delay line 21 is less than 2T, the operation of phase detector 24C of FIG. 8 is the same as that of phase detector 24B in FIG. 6, and the feedback loop continues to drive loop filter capacitor 76 toward a current lock condition.

In the preferred embodiment of FIG. 8, if the feedback loop starts with the delay through delay line 21 being too long, UP will not be neutralized when the delay through delay cell is greater than 2T, and therefore UP remains at a "1" level as long as the delay through delay line 21 is greater than 2T. This allows the delay loop 28, i.e., the charge pump, to charge capacitor 76 without interruption until the delay through delay line 21 is reduced to less than 2T. Therefore, the feedback loop can lock into a permanent correct lock condition in which the delay of delay line 21 is equal to T much more rapidly than if phase detector 24B of FIG. 6 is used.

Thus, the above described phase detector provides false-free lock operation without needing to have extra logic circuitry as required in some prior art DLLs circuits to monitor limit the delay range of the system. No limitation of the range of the delay cells is needed, nor is there any requirement for extra delay range monitoring circuitry.

Also, the same basic design of FIGS. 6 and 8 can be utilized to avoid false-lock conditions irrespective of the number of delay cells in the delay line. It is only necessary to modify the length of FF chain 64 and accordingly modify the number of inputs of the logic gate monitoring circuitry 50–53 if the number of delay cells in the delay line is changed. To increase the number of delay cells in delay line 21, the number of flip-flops in FF 64 must be increased by the same amount, and the output of the last flip-flop in delay line 21 taken as the signal DOWN-ENABLE. The signal UP-ENABLE is controlled by when either DOWN-ENABLE is high or at least one of the flip-flops in contains a "1", so when the number N of delay cells in delay line 21 and the same number N of flip-flops in FF chain 64 is increased, enough more NOR gates (such as NOR gates 50–53) must be added to monitor the additional flip-flop outputs of FF delay chain 64.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A phase detector for use in a delay locked loop circuit, the phase detector comprising:
   (a) first circuitry for determining the status of propagation of a first pulse of a reference clock signal through a delay line of the delay locked loop circuit;
   (b) second circuitry operative in response to the first circuitry for producing a first control signal for causing a loop filter circuit of the delay locked loop circuit to reduce the delay of the delay line, the first control signal representing a first time at which the first pulse of the reference clock signal has progressed entirely through the delay line and a later second time at which a second pulse of the reference clock signal delayed from the first pulse by one reference clock signal period arrives at a first input of the phase detector;
   (c) third circuitry operative in response to the first circuitry for producing a second control signal for causing the loop filter circuit to increase the delay of the delay line, the second control signal representing a third time at which the second pulse of the reference clock signal arrives at the first input of the phase detector and a later fourth time at which the first pulse of the reference clock signal has progressed to the end of the delay line; and
   (d) whereby a filter for filtering the first and second control signals and increasing a delay of the delay line in response to the first control signal if the filtering substantially removes the second control signal or decreasing the delay of the delay line in response to the second control signal if the filtering substantially removes the first control signal.

2. The phase detector of claim 1 wherein the first circuitry and the second circuitry are coupled to a plurality of outputs of the delay line.

3. A delay locked loop circuit, comprising:
   (a) a delay line including an input for receiving a reference clock signal, a plurality of sequentially coupled delay cells each having an output, and a delay control input for receiving a delay control signal;
   (b) a phase detector including a first input for receiving the reference clock signal and a plurality of inputs coupled to a group of outputs of a plurality of the delay cells, respectively;
   (c) a loop filter for generating the delay control signal in response to the phase detector;
   (d) the phase detector including
      i. first circuitry for determining the status of propagation of a first pulse of the reference clock signal through the delay line,
      ii. second circuitry operative in response to the first circuitry for producing a first control signal representing a first time at which the first pulse of the reference clock signal has progressed entirely through the delay line and a later second time at which a second pulse of the reference clock signal delayed from the first pulse by one reference clock signal period arrives at the first input of the phase detector, and
      iii. third circuitry operative in response to the first circuitry for producing a second control signal representing a third time at which the second pulse of the reference clock signal arrives at the first input of the phase detector and a later fourth time at which the first pulse of the reference clock signal has progressed to the end of the delay line;
   (e) the loop filter changing the delay control signal to reduce the delay of the delay line in response to the first control signal or changing the delay control signal to increase the delay of the delay line in response to the second control signal.

4. The delay locked loop circuit of claim 3 wherein the group of outputs includes the outputs of all of the delay cells.

5. The delay locked loop circuit of claim 3 wherein the second circuitry operates in response to the first circuitry to determine the first and second times, and wherein the third circuitry operates in response to the first circuitry to determine the third and fourth times.

6. The delay locked loop circuit of claim 3 wherein the second circuitry produces a first enable signal and wherein the third circuitry includes a phase/frequency detector circuit including a first flip-flop having an output for producing the first control signal in response to the first enable signal, and wherein the second circuitry produces a second enable signal and wherein the phase/frequency detector circuit includes a second flip-flop having an output for producing the second control signal in response to the second enable signal.

7. The delay locked loop circuit of claim 6 wherein the first circuitry includes a flip-flop chain having a first input coupled to receive the first pulse of the reference clock signal, the flip-flop chain including a plurality of sequentially coupled flip-flops clocked by various outputs of the delay cells, the first enable signal being produced in response to an output of a last flip-flop of the flip-flop chain.

8. The delay locked loop circuit of claim 7 wherein the first circuitry includes an ANDing circuit having a first input coupled to the output of a last flip-flop of the flip-flop chain and a second input coupled to the second circuitry.

9. The delay locked loop circuit of claim 8 wherein the second circuitry produces a signal that indicates the presence of a "1" propagating through a last section of the delay line.

10. The delay locked loop circuit of claim 7 wherein the second circuitry includes the flip-flop chain, first ORing circuitry having a plurality of inputs coupled to outputs of various ones of the plurality of sequentially coupled flip-flops, the second enable signal being produced in response to an output of the first ORing circuitry.

11. The delay locked loop circuit of claim 10 wherein the second circuitry also includes second ORing circuitry having a first input coupled to the output of the second ORing circuitry and a second input coupled to receive the first control signal.

12. The delay locked loop circuit of claim 11 wherein the phase/frequency detector includes ANDing circuitry coupled to reset the first and second and flip-flops in response to the first and second control signals.

13. The delay locked loop circuit of claim 9 including ANDing circuitry for logically ANDing the output of the last flip-flop of the flip-flop chain and a result of a logical ORing of the outputs of a last section of the flip-flop chain that corresponds to the last section of the delay line.

14. A delay locked loop circuit, comprising:
(a) a delay line including an input for receiving a reference clock signal, a plurality of sequentially coupled delay cells each having an output, and a delay control input for receiving a delay control signal;
(b) a phase detector including a first input for receiving the reference clock signal and a plurality of inputs coupled to a group of outputs of a plurality of the delay cells, respectively;
(c) a loop filter for generating the delay control signal in response to the phase detector;
(d) the phase detector including
 i. a first enable circuit having a first input for receiving the reference clock signal and including first circuitry having a plurality of inputs coupled to the group of outputs, respectively, for indicating the progress of a first pulse of the reference clock signal through the delay line, the first enable circuit producing a first enable signal which indicates that the first pulse of the reference clock signal has progressed to an end of the delay line,
 ii. a second enable circuit having a first input for receiving the reference clock signal including second circuitry having a plurality of inputs coupled the group of outputs, respectively, for monitoring the progress of the first pulse of the reference clock signal through the delay line, the second enable circuit producing a second enable signal which indicates that the first pulse of the reference clock signal is progressing through but has not reached the end of the delay line,
 iii. a phase/frequency detector circuit having a first input coupled to the first enable signal and a second input coupled to the second enable signal for producing a first control signal coupled to a first input of the loop filter and a second control signal coupled to a second input of the loop filter in response to the first and second enable signals, the first control signal representing a first time at which the first pulse of the reference clock signal has progressed entirely through the delay line and a later second time at which a second pulse of the reference clock signal delayed from the first pulse by one reference clock period arrives at the first input of the phase detector, the second control signal representing a third time at which the second pulse of the reference clock signal arrives at the first input of the phase detector and a later fourth time at which the first pulse of the reference clock signal has progressed to the end of the delay line;
(e) the loop filter changing the delay control signal to reduce the delay of the delay line in response to the first signal control signal or changing the delay control signal to increase the delay of the delay line in response to the second signal control signal.

15. The delay locked loop circuit of claim 14 wherein the group of outputs includes the outputs of all of the delay cells.

16. The delay locked loop circuit of claim 14 wherein the first enable circuit includes a flip-flop chain having a first input coupled to receive the first pulse of the reference clock signal, the flip-flop chain including a plurality of sequentially coupled flip-flops clocked by various outputs of the delay cells, the first enable signal being produced in response to an output of a last flip-flop of the flip-flop chain.

17. The delay locked loop circuit of claim 16 wherein the first enable signal is equal to the output of the last flip-flop of the flip-flop chain.

18. The delay locked loop circuit of claim 16 wherein the first enable circuit includes ANDing circuitry having a first input coupled to the output of a last flip-flop of the flip-flop chain and a second input coupled to the second enable circuit.

19. The delay locked loop circuit of claim 18 wherein the second enable circuit produces a signal that indicates the presence of a "1" propagating through a last section of the delay line.

20. The delay locked loop circuit of claim 19 wherein the ANDing circuitry logically ANDs the output of the last flip-flop of the flip-flop chain and a result of a logical ORing of the outputs of a last section of the flip-flop chain that corresponds to the last section of the delay line.

21. The delay locked loop circuit of claim 16 wherein the second enable circuit includes the flip-flop chain, first ORing circuitry having a plurality of inputs coupled to outputs of various ones of the plurality of sequentially coupled flip-flops, the second enable signal being produced in response to an output of the first ORing circuitry.

22. The delay locked loop circuit of claim 21 wherein the second enable circuit also includes second ORing circuitry having a first input coupled to the output of the second ORing circuitry and a second input coupled to receive the first control signal.

23. The delay locked loop circuit of claim 22 wherein the phase/frequency detector includes ANDing circuitry coupled to reset the first and second and flip-flops in response to the first and second control signals.

24. A method of operating a phase detector in a delay locked loop circuit, comprising:
(a) determining the status of propagation of a first pulse of a reference clock signal through a delay line of the delay locked loop circuit;
(b) producing a first control signal in response to the status of propagation such that the first control signal represents a first time at which the first pulse of the reference clock signal has progressed entirely through the delay line and a later second time at which a second pulse of the reference clock signal delayed from the first pulse by one reference clock signal period arrives at a first input of the phase detector;
(c) producing a second control signal in response to the status of propagation such that the second control signal represents a third time at which the second pulse of the reference clock signal arrives at the first input of the phase detector and a later fourth time at which the first pulse of the reference clock signal has progressed to the end of the delay line;
(d) filtering the first and second control signals; and
(e) increasing a delay of the delay line in response to the first control signal if the filtering substantially removes the second control signal or decreasing the delay of the delay line in response to the second control signal if the filtering substantially removes the first control signal.

25. A delay locked loop circuit, comprising:
(a) means for determining the status of propagation of a first pulse of a reference clock signal through a delay line of the delay locked loop circuit;
(b) means for producing a first control signal in response to the status of propagation such that the first control signal represents a first time at which the first pulse of the reference clock signal has progressed entirely through the delay line and a later second time at which a second pulse of the reference clock signal delayed from the first pulse by one reference clock signal period arrives at a first input of the phase detector;
(c) means for producing a second control signal in response to the status of propagation such that the second control signal represents a third time at which the second pulse of the reference clock signal arrives at the first input of the phase detector and a later fourth time at which the first pulse of the reference clock signal has progressed to the end of the delay line;
(d) means for filtering the first and second control signals; and
(e) means for increasing a delay of the delay line in response to the first control signal if the filtering substantially removes the second control signal or decreasing the delay of the delay line in response to the second control signal if the filtering substantially removes the first control signal.

26. A method of operating a delay locked loop circuit including
i. a delay line including an input for receiving a reference clock signal, a plurality of sequentially coupled delay cells each having an output, and a delay control input for receiving a delay control signal, and
ii. a loop filter for generating the delay control signal, the method comprising:
(a) applying the reference clock signal to a first input of a phase detector and applying a group of outputs of a plurality of the delay cells to a plurality of inputs of a phase detector, respectively;
(b) determining the status of propagation of a first pulse of the reference clock signal through the delay line;
(c) producing a first control signal in response to the status of propagation such that a first control signal represents a first time at which the first pulse of the reference clock signal has progressed entirely through the delay line and a later second time at which a second pulse of the reference clock signal delayed from the first pulse by one reference clock signal period arrives at a first input of the phase detector;
(d) producing a second control signal in response to the status of propagation such that the second control signal represents a third time at which the second pulse of the reference clock signal arrives at the first input of the phase detector and a later fourth time at which the first pulse of the reference clock signal has progressed to the end of the delay line;
(e) filtering the first and second control signals; and
(f) increasing a delay of the delay line in response to the first control signal if the filtering substantially removes the second control signal or decreasing the delay of the delay line in response to the second control signal if the filtering substantially removes the first control signal.

27. The method of claim 26 wherein step (b) includes monitoring the outputs of all of the delay cells.

28. The method of claim 27 including resetting a phase/frequency detector circuit including a first flip-flop having an output for producing the first control signal in response to a first enable signal representative a status of propagation of the first pulse of the reference clock signal through the delay line, and wherein the second circuitry produces a second enable signal representative of the status of propagation of the first pulse of the reference clock signal through the delay line, wherein the phase/frequency detector circuit includes a second flip-flop having an output for producing the second control signal in response to the second enable signal.

29. The method of claim 28 including performing the monitoring by means of a flip-flop chain having a first input coupled to receive the first pulse of the reference clock signal, the flip-flop chain including a plurality of sequentially coupled flip-flops, the method including clocking the sequentially coupled flip-flops by various outputs of the delay cells and producing the first enable signal in response to an output of a last flip-flop of the flip-flop chain.

30. The method of claim 29 wherein the monitoring includes logically ORing the outputs of a plurality of the sequentially coupled flip-flops to indicate the presence of a "1" propagating through the delay line.

31. The method of claim 29 wherein the monitoring includes logically ORing the outputs of a plurality of a last section of the sequentially coupled flip-flops to indicate the presence of a "1" propagating through a last section of the delay line.

* * * * *